United States Patent
Chang et al.

(10) Patent No.: US 9,704,974 B2
(45) Date of Patent: Jul. 11, 2017

(54) PROCESS OF MANUFACTURING FIN-FET DEVICE

(71) Applicant: TAIWAN SEMICONDUCTOR MANUFACTURING CO., LTD., Hsinchu (TW)

(72) Inventors: Chia-Wei Chang, Taichung (TW); An-Shen Chang, Jubei (TW); Eric Chih-Fang Liu, Taipei (TW); Ryan Chia-Jen Chen, Chiayi (TW); Chia-Tai Lin, Taichung (TW); Chih-Tang Peng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/688,885

(22) Filed: Apr. 16, 2015

(65) Prior Publication Data

US 2016/0308027 A1    Oct. 20, 2016

(51) Int. Cl.
*H01L 29/66* (2006.01)
*H01L 21/308* (2006.01)

(52) U.S. Cl.
CPC .... *H01L 29/66795* (2013.01); *H01L 21/3086* (2013.01)

(58) Field of Classification Search
CPC ......... H01L 21/823431; H01L 21/3086; H01L 29/66795; H01L 29/785; H01L 29/0649; H01L 29/6681
See application file for complete search history.

(56) References Cited

U.S. PATENT DOCUMENTS

| | | | |
|---|---|---|---|
| 7,989,355 B2 | 8/2011 | Shieh et al. | |
| 8,603,893 B1 | 12/2013 | Wei et al. | |
| 8,703,557 B1 | 4/2014 | Cai et al. | |
| 2010/0203734 A1* | 8/2010 | Shieh | H01L 21/3086 438/706 |
| 2014/0117419 A1* | 5/2014 | Juengling | H01L 21/823431 257/288 |
| 2014/0264717 A1* | 9/2014 | Shieh | H01L 29/06 257/499 |
| 2014/0291770 A1 | 10/2014 | Yin et al. | |
| 2014/0353760 A1 | 12/2014 | Loubet et al. | |
| 2014/0367795 A1 | 12/2014 | Cai et al. | |
| 2015/0115418 A1* | 4/2015 | Wei | H01L 21/3086 257/639 |
| 2015/0147874 A1* | 5/2015 | Huang | H01L 21/823431 438/514 |
| 2015/0162436 A1* | 6/2015 | Toh | H01L 29/785 257/401 |
| 2015/0263045 A1* | 9/2015 | Leobandung | H01L 21/823431 257/351 |

(Continued)

*Primary Examiner* — Jaehwan Oh
(74) *Attorney, Agent, or Firm* — Maschoff Brennan

(57) ABSTRACT

A process of manufacturing a Fin-FET device, and the process includes following steps. An active fin structure and a dummy fin structure are formed from a substrate, and an isolation layer is covered over the active fin structure and the dummy fin structure. Then, the isolation layer above the dummy fin structure is removed, and the dummy fin structure is selectively etched, which a selective ratio of the dummy fin structure to the isolation layer is over 8.

20 Claims, 17 Drawing Sheets

(56) References Cited

U.S. PATENT DOCUMENTS

2015/0294976 A1* 10/2015 Kim .................. H01L 27/1104
438/702
2015/0357439 A1* 12/2015 Liu .................. H01L 29/66795
257/401

* cited by examiner

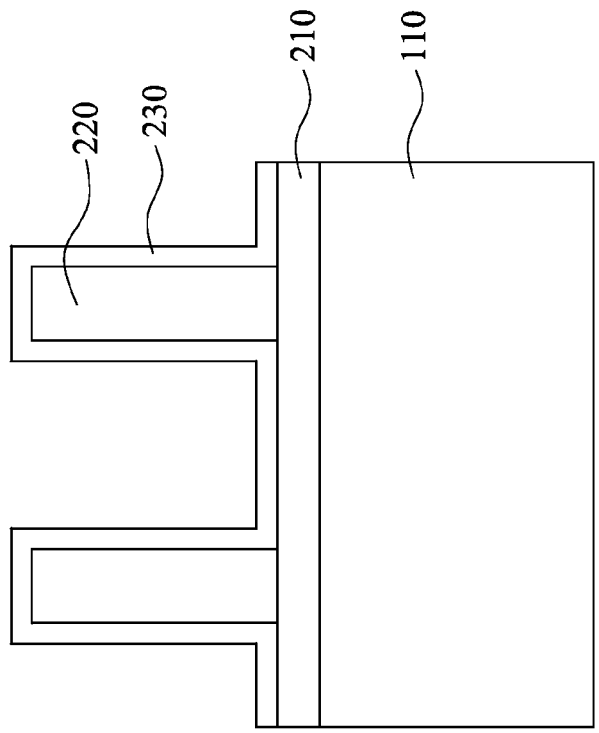
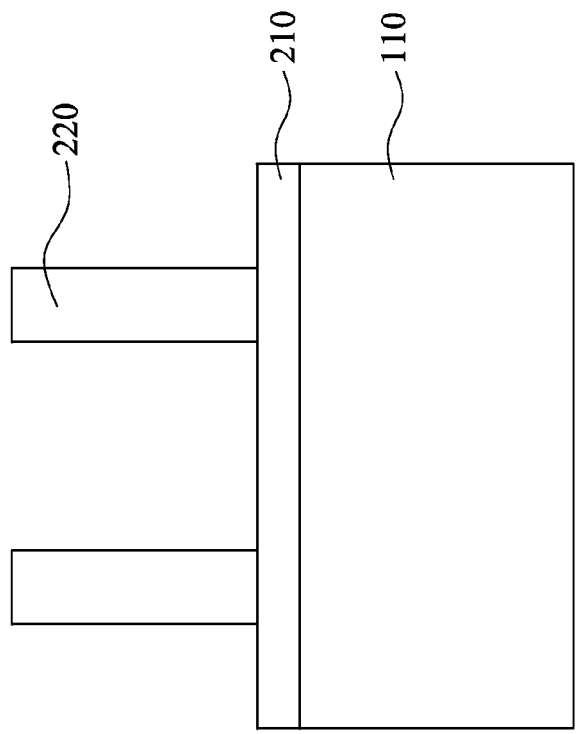
Fig. 3B
Fig. 3A

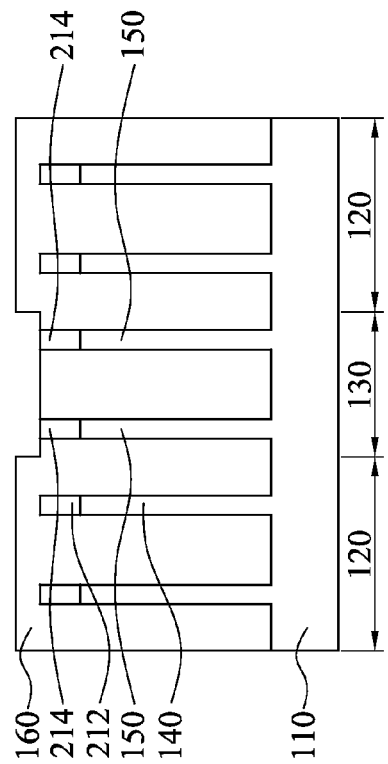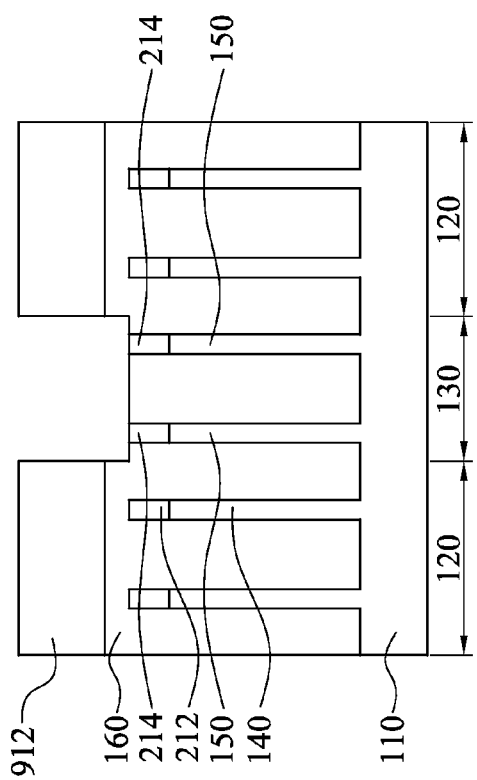

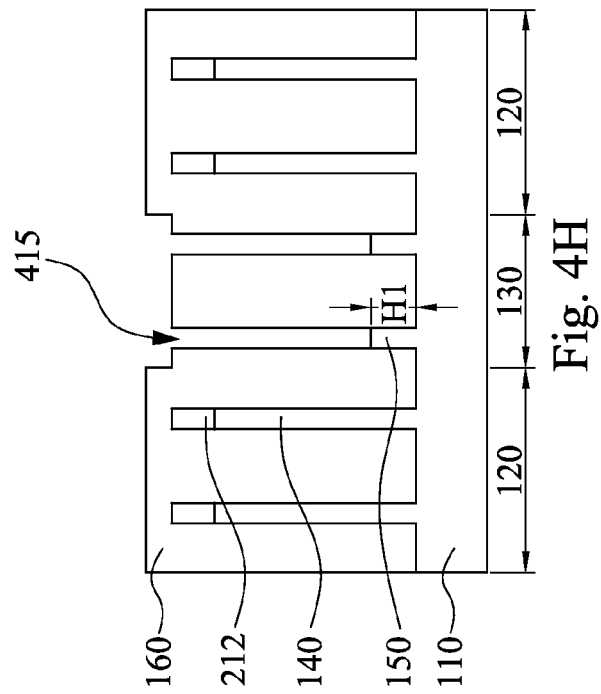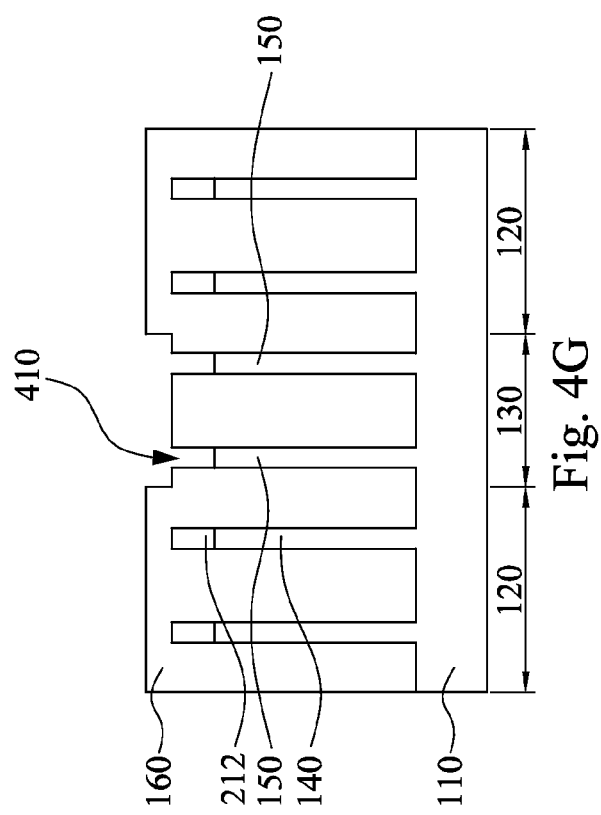

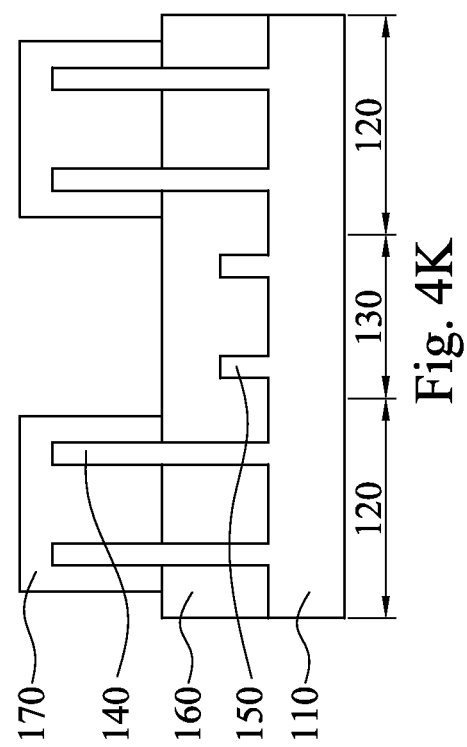

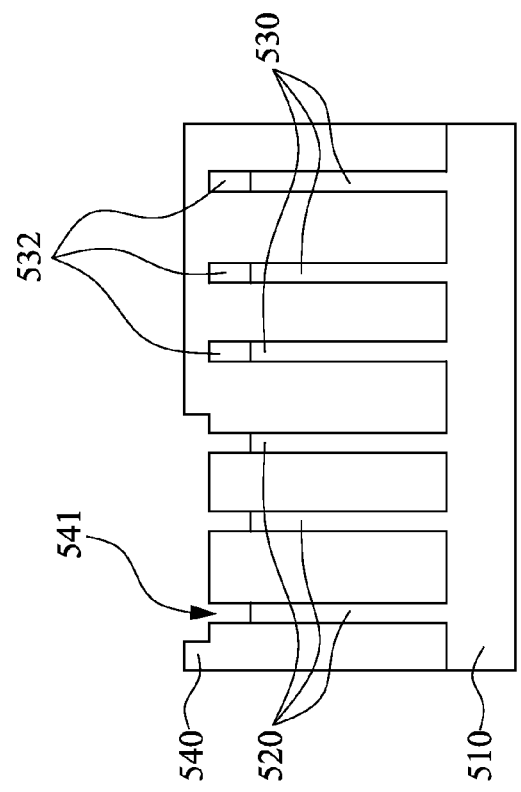
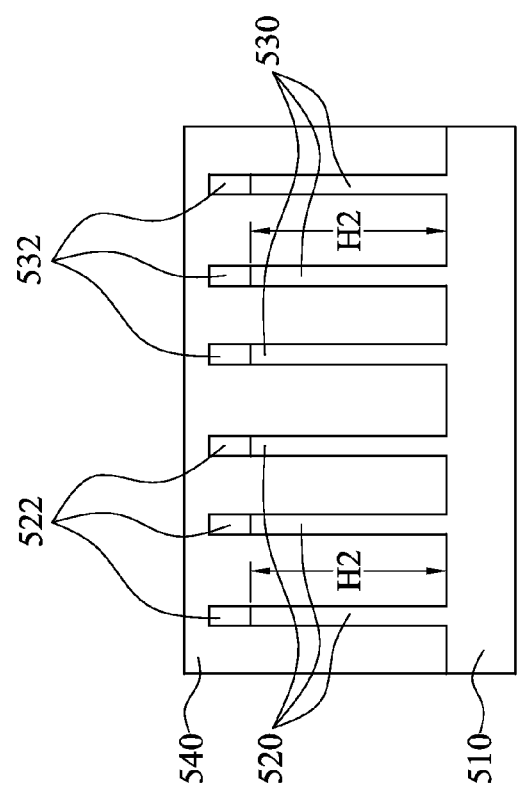

PROCESS OF MANUFACTURING FIN-FET DEVICE

BACKGROUND

The semiconductor integrated circuit (IC) industry has experienced rapid growth. Over the course of the growth, functional density of the semiconductor devices has increased with the decrease of device feature size or geometry. The scaling down process generally provides benefits by increasing production efficiency, reducing costs, and/or improving device performance, but increases complexity of the IC manufacturing processes.

To address the increase of manufacturing complexity, similar advances in IC processing and manufacturing are necessary. For example, a three dimensional transistor, such as a fin-like field-effect transistor (Fin-FET), has been introduced to replace a planar transistor. In the manufacturing process of the Fin-FET devices, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to 3G are cross-sectional views of the Fin-FET device in FIG. 1 at an intermediate stage of fabricating the fin spacers by quadrup-patterning methodology.

FIG. 4A to 4K are cross-sectional views of the Fin-FET device in FIG. 1 along the line AA at an intermediate stage of fabrication.

FIG. 5A to 5H are cross-sectional views of the Fin-FET device in FIG. 1 at an in intermediate stage of controlling heights of the fin structures.

DETAILED DESCRIPTION

Figure 1:
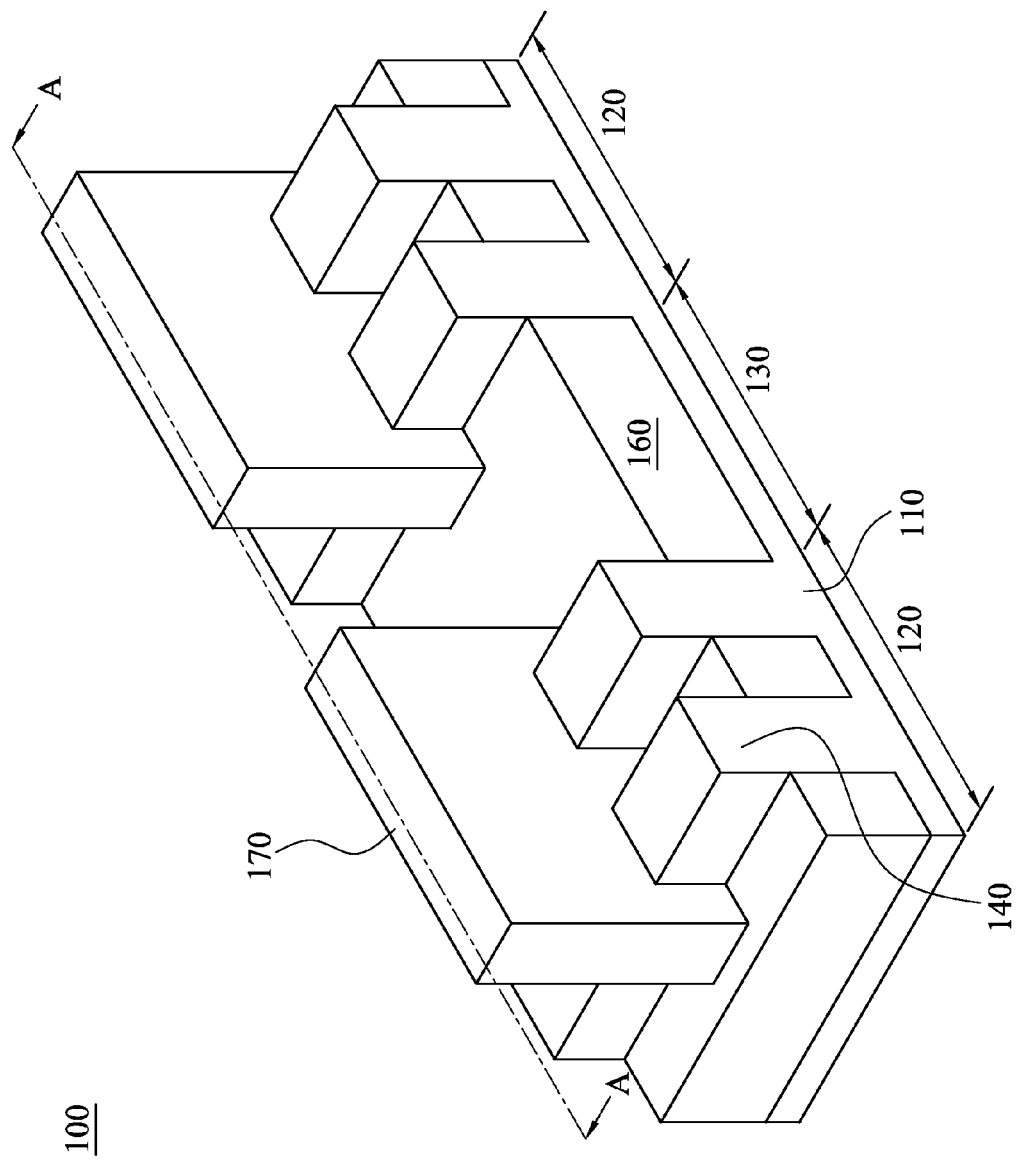
FIG. 1 is a Fin-FET device in accordance to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the critical dimension (CD) of device is scaled down, an overlay error margin is also reduced when performing a fin cut process while fabricating a fin field effect transistor (Fin-FET) device. The reduced overlay error margin becomes increasing difficult to manage. Generally, a plurality of fin spacers are formed on the substrate, and a fin cut process could be performed before or after forming the fin structures from the substrate. For example, a bottom layer covers the fin spacers and acts as the mask to remove unwanted fin spacers, and then the substrate is etched through the wanted fin spacers to form the fin structures. In another example, the substrate is etched through the fin spacers to form the fin structures, and the bottom layer covers the fin structures to act as the mask for removing unwanted fin structures. However, the uniformity of the bottom layer is difficult to be controlled, and thus causes damage and residue defect on the fin structures. Besides, the fin structures suffer the bending problem during annealing the isolation layer between the fin structures. Therefore, it is necessary to provide an improved method to perform the fin cut process.

FIG. 1 is a Fin-FET device in accordance to various embodiments of the present disclosure. A fin field-effect transistor (Fin-FET) device 100 includes a substrate 110 having active regions 120 and an isolation region 130 between the active regions 120. An active fin structure 140 having functionality in the Fin-FET device 100 is fabricated in the active region 120, and an isolation layer 160 separates the adjacent active fin structures 140. Besides, a gate 170 is disposed on the active fin structure 140 and overlaps with the sidewalls of the active fin structure 140. A fin-cut process removes the unwanted fin structures in the isolation region 130 from a circuit or device being fabricated. In other words, the fin-cut process is able to be applied to remove the unwanted fin structure depending on a corresponding layout of the circuit or device in fabrication. In some embodiments, the fin-cut process remains a dummy fin structure in the isolation region 130, and the isolation layer 160 covers the dummy fin structure.

The present embodiments provide a method of manufacturing a Fin-FET device, including a method of performing fin-cut process to manufacture the Fin-FET device as shown in FIG. 1. In some embodiments, in order to form the fine structures for current and future advanced semiconductor processing nodes, double patterning methodology is used. FIG. 2A to 2D are cross-sectional views of the Fin-FET device in FIG. 1 at an intermediate stage of fabricating the fin spacers by double-patterning methodology.

Figure 2B:
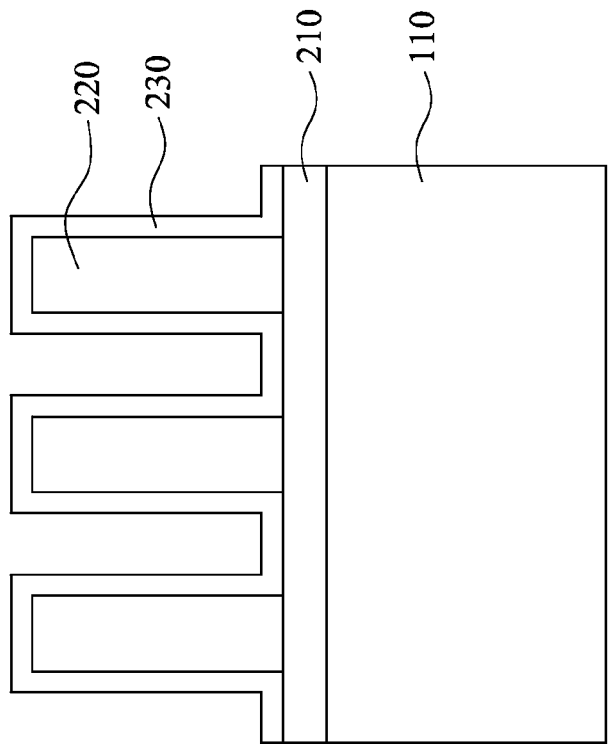
FIG. 2A to 2D are cross-sectional views of the Fin-FET device in FIG. 1 at an intermediate stage of fabricating the fin spacers by double-patterning methodology.
Figure 2A:
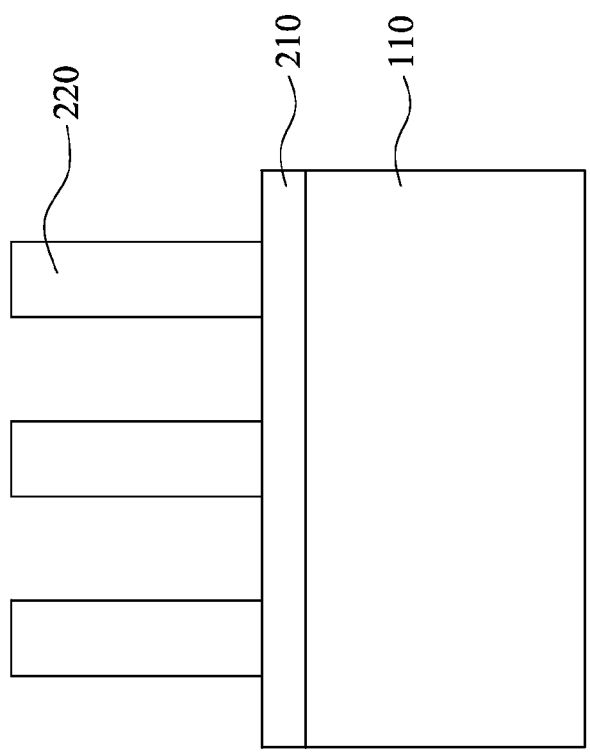

As shown in FIG. 2A, a substrate 110, a hardmask layer 210 and a first dummy pattern 220 is provided. The hardmask layer 210 is formed on the substrate 110, and the first dummy pattern 220 is formed on the hardmask layer 210. The hardmask layer 210 and the first dummy pattern 220 may be formed by using a deposition process, such as a CVD or a PVD process, but not limited thereto. Besides, a patterning process is performed to form the first dummy pattern 220, such as photolithography.

In some embodiments, the substrate 110 may be a bulk silicon substrate. In various embodiments, the substrate 110 may include an elementary semiconductor including silicon or germanium in crystal, polycrystalline, and/or an amorphous structure. In various embodiments, the substrate 110 may include a compound semiconductor including silicon carbide, gallium arsenic, gallium phosphide, indium phosphide, indium arsenide, and/or indium antimonide. In various embodiments, the substrate 110 may include an alloy semiconductor including SiGe, GaAsP, AlInAs, AlGaAs, GaInAs, GaInP, and/or GaInAsP; any other suitable material; and/or combinations thereof.

In some embodiments, the substrate 110 is a silicon-on-insulator (SOI) substrate. The SOI substrate is fabricated using separation by implantation of oxygen (SIMOX), wafer bonding, and/or other suitable methods, and an exemplary insulator layer may be a buried oxide layer (BOX).

In various embodiments, the hardmask layer 210 includes materials such as silicon oxide ($SiO_2$), silicon nitride (SiN) or silicon oxynitride (SiON), and the first dummy pattern 220 may be a carbon-based polymer, an amorphous carbon film, an amorphous silicon, polysilicon, or other material that may be patterned and selectively etched in an efficient manner.

In FIG. 2B, a first spacer layer 230 is formed over the first dummy pattern 220. The first spacer layer 230 covers the top surface and the sidewalls of the first dummy pattern 220, and may include a dielectric material, such as silicon oxide, silicon nitride, or silicon oxynitride. In various embodiments, forming the first spacer layer 230 includes using a deposition process, such as a CVD, a PVD, or an ALD process.

Figure 2C:
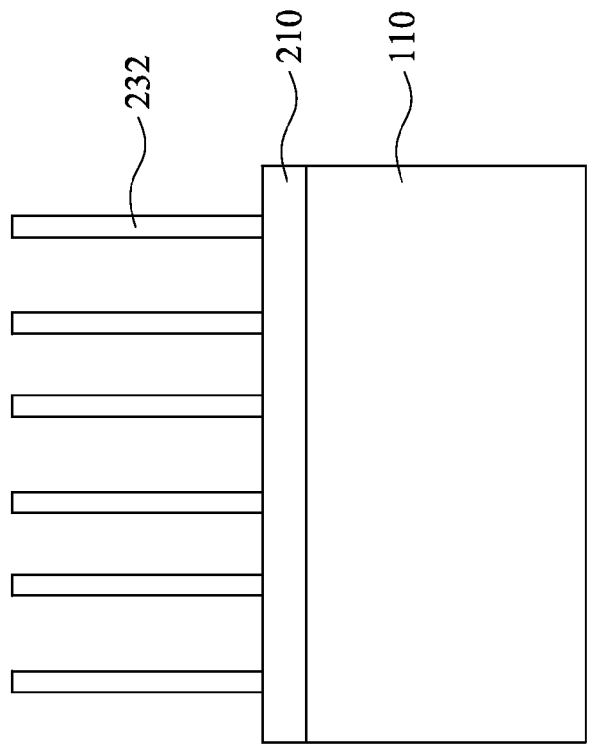

In FIG. 2C, portions of the first spacer layer 230 are removed. An anisotropic etch process is applied so that the first spacer layer 230 remains on sidewalls of the first dummy pattern 220. Portions of the first spacer layer 230 disposed over the top of the first dummy pattern 220 are removed, and portions of the first spacer layer 230 disposed over the surface of the hardmask layer 210 are also removed. Therefore, the first spacer layer 230 remains on sidewalls of the first dummy pattern 220, which are also referred as fin spacers 232. In various embodiments, removing portions of the first spacer layer 230 includes using a plasma etching process.

Figure 2D:
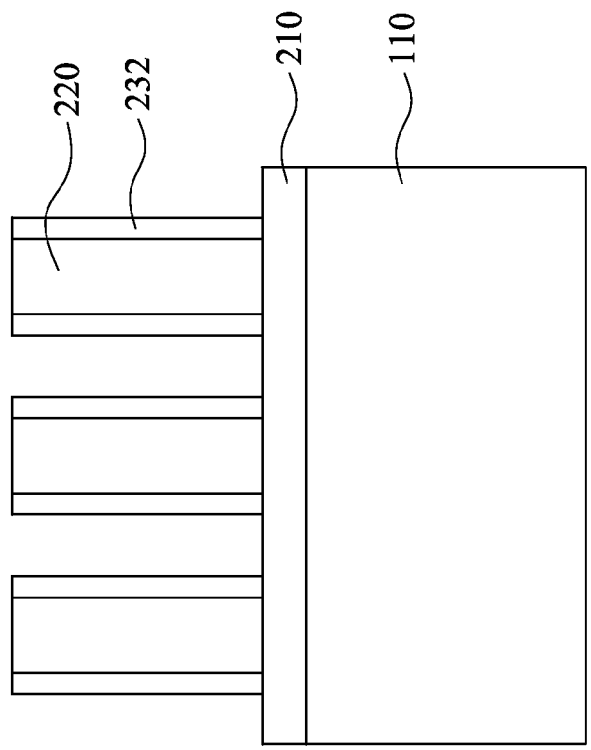

In FIG. 2D, the first dummy pattern 220 is removed. The first dummy pattern 220 is removed using an etching process, such as dry etching or wet etching, and the fin spacers 232 are remained on the hardmask 210.

In various embodiments, quadrup-patterning methodology may be used to fabricate the fin spacers. The quadrup-patterning methodology refers to two iterations of double-patterning methodology that leads to quartering of the pitch between the fin spacers. FIG. 3A to 3G are cross-sectional views of the Fin-FET device in FIG. 1 at an intermediate stage of fabricating the fin spacers by quadrup-patterning methodology.

In FIG. 3A, a substrate 110, a hardmask layer 210 and a first dummy pattern 220 is provided. The hardmask layer 210 is formed on the substrate 110, and the first dummy pattern 220 is formed on the hardmask layer 210. The hardmask layer 210 and the first dummy pattern 220 may be formed by using a deposition process, such as a CVD or a PVD process, but not limited thereto. Besides, a patterning process is performed to form the first dummy pattern 220, such as photolithography.

In FIG. 3B, a first spacer layer 230 is formed over the first dummy pattern 220. The first spacer layer 230 covers the top surface and the sidewalls of the first dummy pattern 220, and may include a dielectric material, such as silicon oxide, silicon nitride, or silicon oxynitride.

Figure 3D:
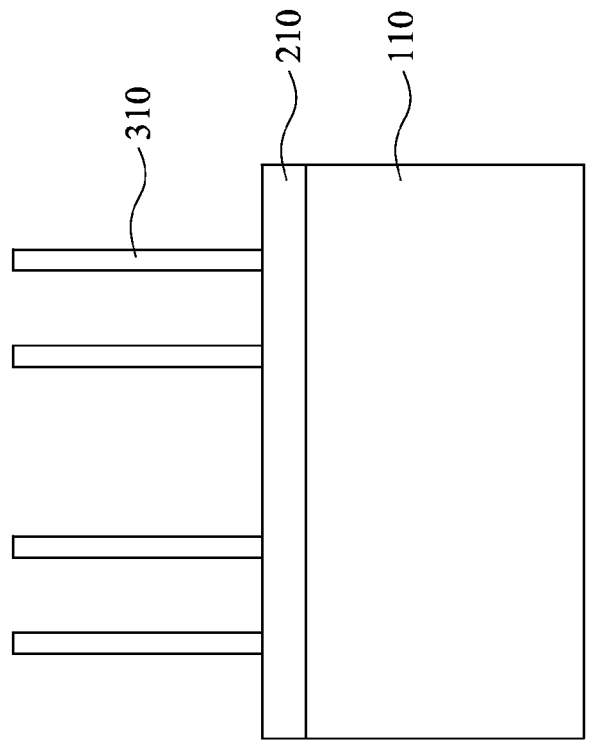
Figure 3C:
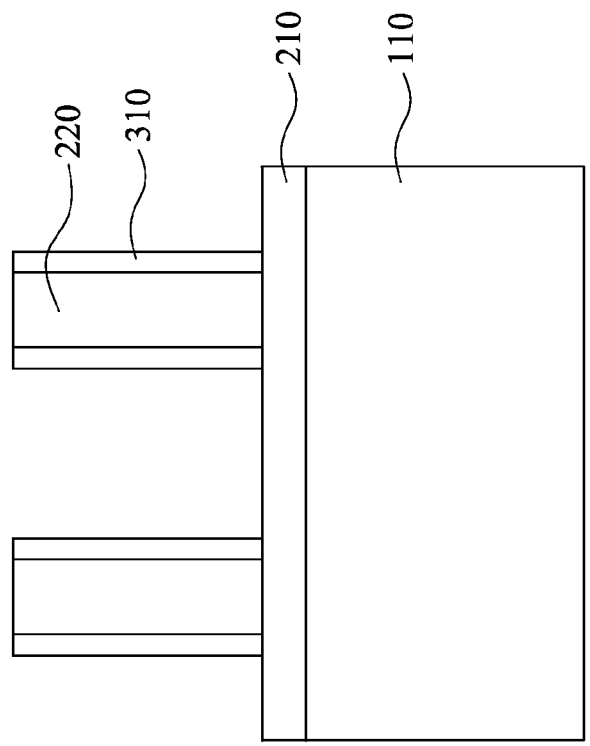

In FIG. 3C, portions of the first spacer layer 230 is removed. An anisotropic etch process is applied so that the first spacer layer 230 remains on sidewalls of the first dummy pattern 220. Portions of the first spacer layer 230 disposed over the top of the first dummy pattern 220 are removed, and portions of the first spacer layer 230 disposed over the surface of the hardmask layer 210 are also removed. Therefore, the first spacer layer 230 remains on sidewalls of the first dummy pattern 220, which are also referred as a second dummy pattern 310.

In FIG. 3D, the first dummy pattern 220 is removed. The first dummy pattern 220 is removed using an etching process, such as dry etching or wet etching, and the second dummy pattern 310 is remained on the hardmask 210.

Figure 3F:
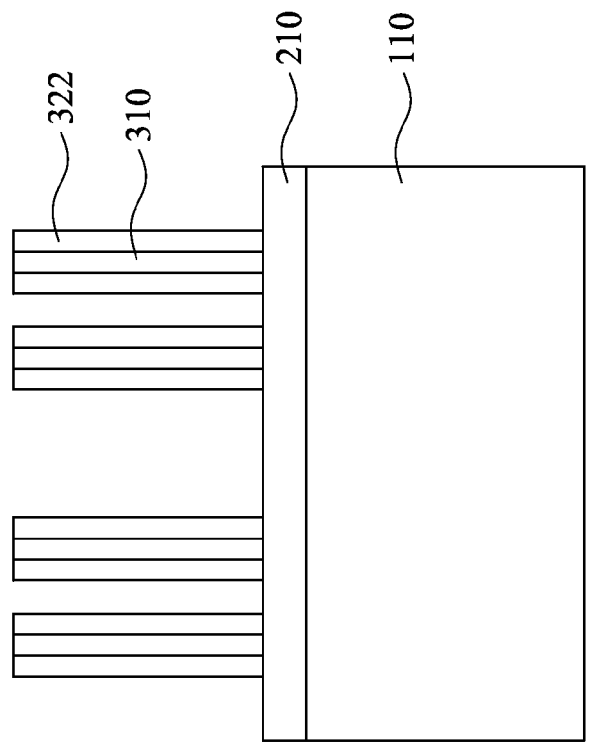
Figure 3E:
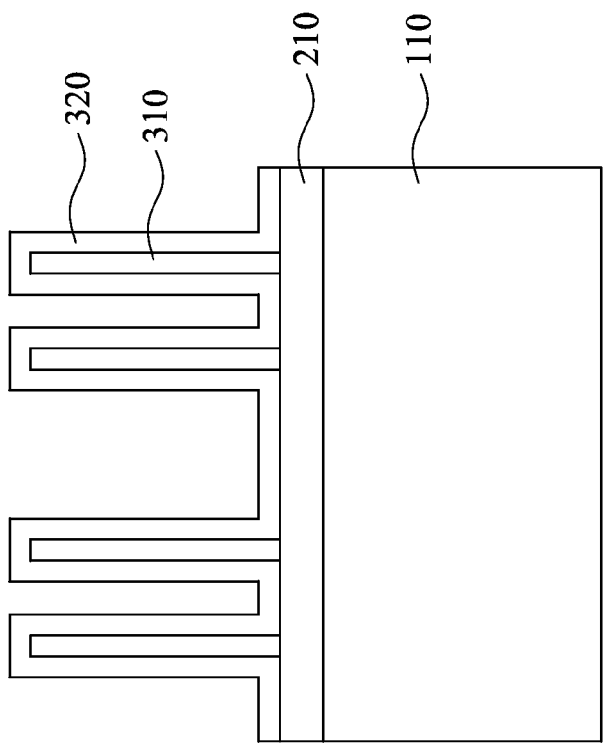

In FIG. 3E, a second spacer layer 320 is formed over the second dummy pattern 310. The second spacer layer 320 covers the top surface and the sidewalls of the second dummy pattern 310, and may include a dielectric material, such as silicon oxide, silicon nitride, or silicon oxynitride.

Continuing in FIG. 3F, portions of the second spacer layer 320 are removed. An anisotropic etch process is applied so that the second spacer layer 320 remains on sidewalls of the second dummy pattern 310. Portions of the second spacer layer 320 disposed over the top of the second dummy pattern 310 are removed, and portions of the second spacer layer 320 disposed over the surface of the hardmask layer 210 are also removed. Therefore, the second spacer layer 320 remains on sidewalls of the second dummy pattern 310, which are also referred as fin spacers 322.

Figure 3G:
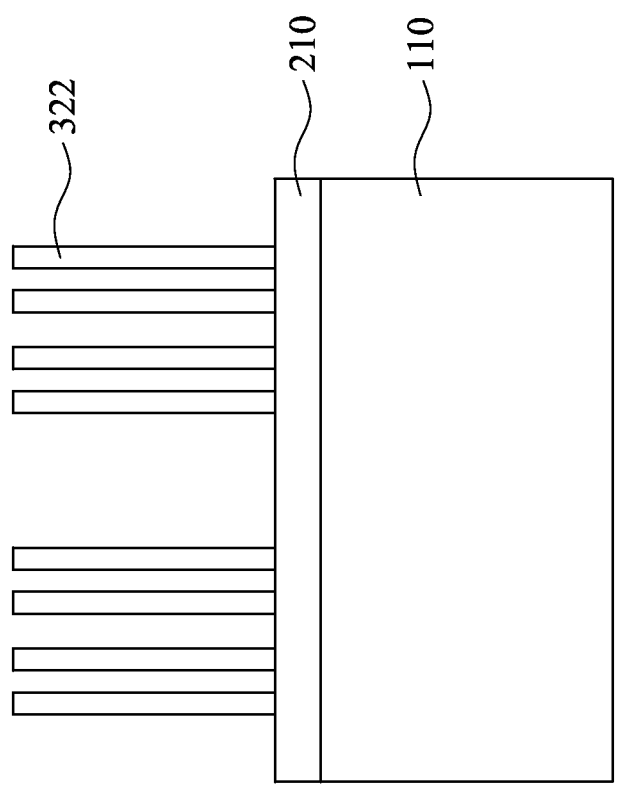

Continuing in FIG. 3G, the second dummy pattern 310 is removed. The second dummy pattern 310 is removed using an etching process, such as dry etching or wet etching, and the fin spacers 322 are remained on the hardmask 210. Using the quadrup-patterning methodology, the pitch between the adjacent fin spacers 322 may be further decreased.

To be noticed, the present embodiments describe the steps following FIG. 2D to manufacture the Fin-FET device as shown in FIG. 1, but not limited thereto. Since the pitch between the fin spacers is further decreased by using the quadrup-patterning methodology, the fin spacers shown in FIG. 3G are also applicable to fabricate the Fin-FET device shown in FIG. 1.

In FIG. 4A to 4K, it is referred to further clarify the process of manufacturing a Fin-FET device as shown in FIG. 1. FIG. 4A to 4K are cross-sectional views of the Fin-FET device in FIG. 1 along the line AA at an intermediate stage of fabrication. The fin spacers 232 fabricated in FIG. 2D act as a mask to form the fin structures from the substrate 110.

Figure 4B:
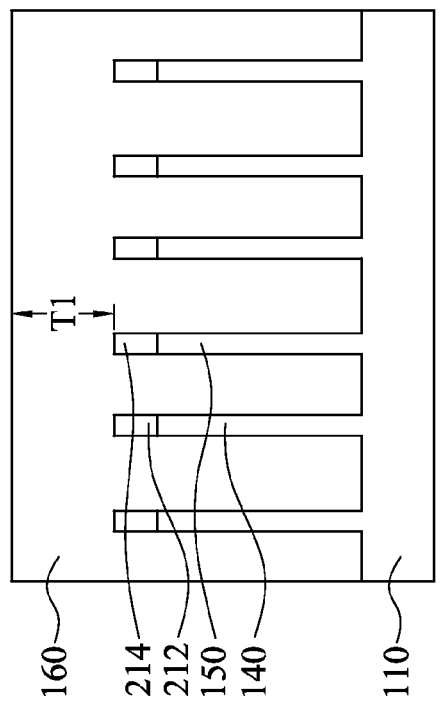
Figure 4A:
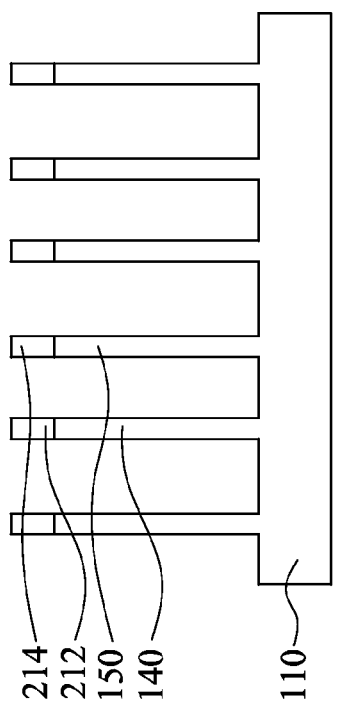

As shown in FIG. 4A, the active fin structure 140 and the dummy fin structure 150 are formed from the substrate 110. Portions of the substrate 110 are removed to form the active fin structure 140 and the dummy fin structure 150. Besides, portions of hard mask 220 are removed simultaneously to remain a first hardmask 212 on the active fin structure 140 and a second hardmask 214 on the dummy fin structure 150. In FIG. 4A, the fin spacers 232 acts as the mask to perform an anisotropic etching process for removing portions of the substrate 110 and the hardmask layer 210 through the fin spacers 232. Therefore, the active fin structure 140, the dummy fin structure 150, the first hardmask 212 and second hardmask 214 are formed. After the etching process, the fin spacers 232 are removed by a dry etching process using plasma of $CF_4$, $CH_2F_2$ or combination thereof. Besides, the fin spacers 232 may be removed by a wet etching process using solution of TMAH or $NH_3$.

In FIG. 4B, an isolation layer 160 is covered over the active fin structure 140 and the dummy fin structure 150. More specifically, the isolation layer 160 also covers over the first hardmask 212 and second hardmask 214. The isolation layer 160 is disposed over the substrate 110 with the active fin structure 140 and the dummy fin structure 150 embedded into the isolation layer 160. Besides, the isolation layer 160 includes a thickness T1 above the first hardmask 212 and second hardmask 214. After covering the active fin structure 140 and the dummy fin structure 150 with the isolation layer 160, the isolation layer 160 is annealed. In various embodiments, the isolation layer 160 includes silicon oxide, silicon nitride, silicon oxynitride, or combinations thereof. In some embodiments, a deposition process, such as a CVD or PVD process, may be applied to form the isolation layer 160.

Figure 4C:
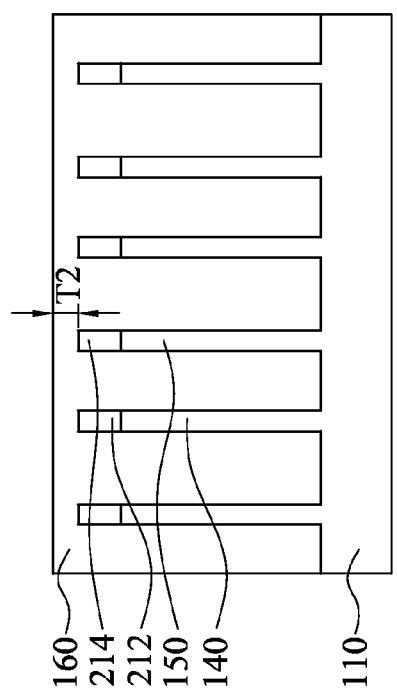

In FIG. 4C, a top surface of the isolation layer 160 is planarized. A first CMP (chemical mechanical planarization) process is applied to planarize the top surface of the isolation layer 160. The first CMP process also reduces thickness of the isolation layer 160 above the first hardmask 212 and second hardmask 214 from the thickness T1 to a thickness T2. However, it is difficult to control the first CMP process stopping at the thickness T2. In this regard, according to some embodiments, the first CMP process first totally removes the isolation layer 160 above the first hardmask 212 and second hardmask 214 and stops at the first hardmask 212 and second hardmask 214 to planarize the top surface of the isolation layer 160. Then, the insulating material, such as silicon oxide, silicon nitride, silicon oxynitride, is deposited on the plane top surface to form the thickness T2 above the first hardmask 212 and second hardmask 214.

Figure 4D:
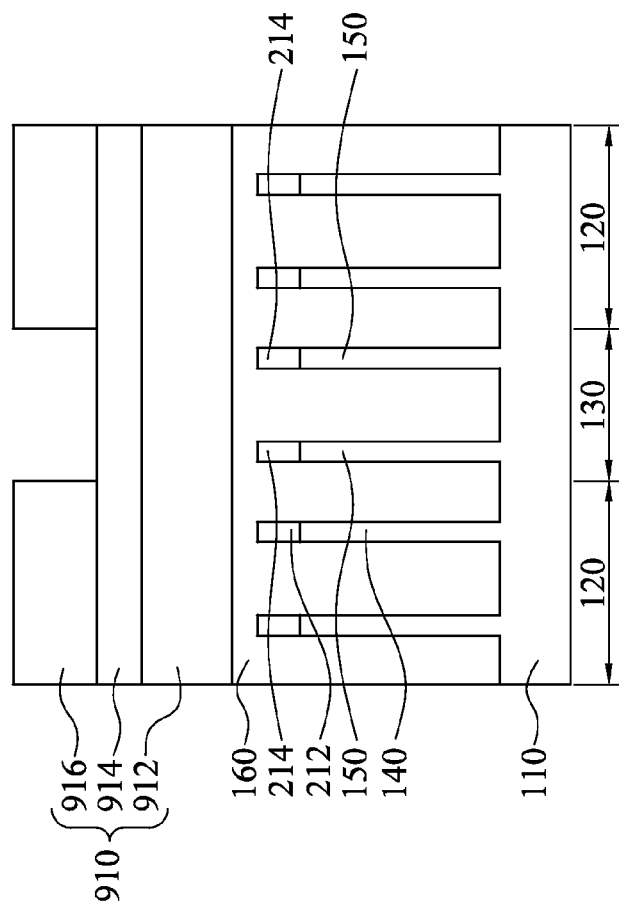

In FIG. 4D, a mask layer 910 is formed on the isolation layer 160. The mask layer 910 has a pattern to define the active regions 120 and the isolation region 130 in the isolation layer 160. In the subsequent process, the dummy fin structures 150 in the isolation region 130 are removed. The mask layer 910 is a multi-layer structure including a bottom layer 912, a middle layer 914 and a patterned photoresist 916. Since the top surface of the isolation layer 160 is planarized, the mask layer 910 could be formed on the plane surface to assure the uniformity of the bottom layer 912, the middle layer 914 and the patterned photoresist 916. In various embodiments, the middle layer 914 may include anti-reflective materials (ARC) or backside anti-reflective materials (BARC) to aid in the exposure and focus of the patterned photoresist 916, and the bottom layer 912 may be a carbon-base polymer.

Continuing in FIG. 4E, the middle layer 914 and the bottom layer 912 are patterned by the patterned photoresist 916, the portion of bottom layer 912 and the portion of the isolation layer 160 above the dummy fin structures 150 are removed, and the middle layer 914 is also removed during this step. Therefore, the second hardmask 214 on the dummy fin structure 150 is exposed. After that, the bottom layer 912 is removed to form the structure shown in FIG. 4F. In some embodiments, the portion of the isolation layer 160 above the dummy fin structures 150 is removed by a dry etching process using fluorine-based plasma.

Continuing in FIG. 4G, the second hardmask 214 is removed. After removing the portion of the isolation layer 160 above the dummy fin structures 150, an etching process is applied to remove the second hardmask 214. The second hardmask 214 is removed to form an opening 410 exposing the dummy fin structure 150. However, the first hardmask 212 protected by the isolation layer 160 is remained on the active fin structure 140. In various embodiments, the second hardmask 214 is removed by a wet etching process using $H_3PO_4$ solution. In various embodiments, the second hardmask 214 is removed by a dry etching process using plasma of $CH_3F$, $CH_2F_2$, $O_2$ or combination thereof.

Continuing in FIG. 4H, the dummy fin structure 150 is selective etched through the opening 410, and an opening 415 is formed. The isolation layer 160 is used as a mask to perform the fin-cut process. Typically, a carbon-base polymer layer in the art acts as a mask for removing unwanted fin structures. However, the uniformity of the carbon-base polymer layer is difficult to be controlled. Besides, the removal of the unwanted fin structures also removes the carbon-base polymer layer covering the wanted fin structures, which causes damage and residue defect on the wanted fin structures. In some embodiments, the first CMP process is performed to assure the uniformity of the isolation layer 160, which is conducive to act as a mask to enlarge the window of the fin cut process. Specifically, the fin-cut process of the present embodiments is much easier to be controlled to avoid removal of the isolation layer 160 covering the active fin structure 140. On the other hand, using the isolation layer 160 as the mask is beneficial to control profile and critical dimension of the opening 415 when selective etching the dummy fin structure 150. A removing speed of the dummy fin structure 150 is 8 to 15 times of a removing speed of the isolation layer 160 in order to control the profile and critical dimension of the opening 410 during selective etching the dummy fin structure 150. Therefore, a selective ratio of the dummy fin structure 150 to the isolation layer 160 is controlled in a range from about 8 to about 15. To be noticed, this selective ratio is over 8, which means the removing speed of the dummy fin structure 150 is over 8 times higher than the removing speed of the isolation layer 160, to assure that the fin-cut process does not affect the profile of the active fin structure 140. If the selective ratio is lower than 8, the isolation layer 160 adjacent to the dummy fin structure 150 is also removed simultaneously to expose sidewalls of the active fin structure 140. In this situation, the fin-cut process affects the profile of the active fin structure 140. In various embodiments, the dummy fin structure 150 is selective etched by a dry etching process using plasma of HBr, $Cl_2$, $O_2$, $N_2$ or combination thereof, but not limited thereto. In various embodiments, the selective etching process is a wet etching process using a solution of TMAH (tetramethylammonium hydroxide), $NH_3$ or combination thereof, but not limited thereto. In various embodiments, the selective ratio is in a range from about 10 to about 13.

As shown in FIG. 4H, the dummy fin structure 150 includes a height H1 above the substrate 110 after selective etching, but not limited thereto. In various embodiments, the selective ratio is controlled to totally remove the dummy fin structure 150 above the substrate 110. In some embodiments, the selective ratio is controlled to regulate the height H1 above the substrate 110. Besides, material same as the isolation layer 160 is refilled in the opening 415 in the subsequent process. In case of controlling the selective ratio to remain the dummy fin structure 150 with higher height H1 on the substrate 110, the mechanical loading during refilling the material is reduced, and thus enhances efficiency of the subsequent process.

Figure 4J:
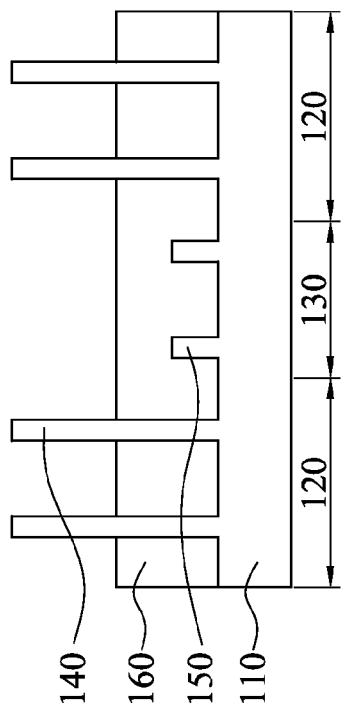
Figure 4I:
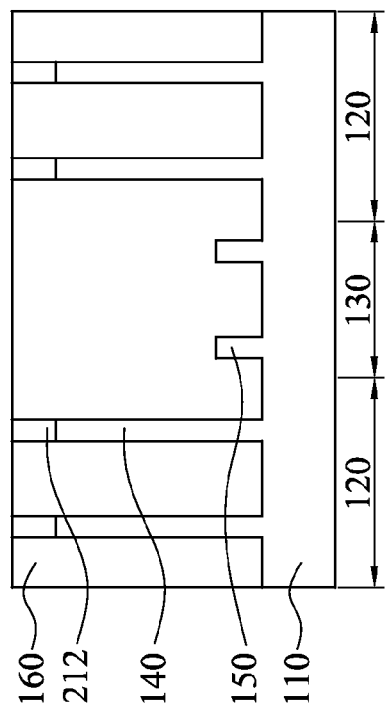

In FIG. 4I, material same as the isolation layer 160 is refilled in the opening 415, and a second CMP process is performed to planarize the top surface of the isolation layer 160. In various embodiments, the material is different from the isolation layer 160. The second CMP process removes the excess material and stops at the first hardmask 212 to assure that the isolation layer 160 has a plane top surface.

In FIG. 4J, the first hardmask 212 is removed, and the isolation layer 160 is recessed corresponding to a top surface of the active fin structure 140. As aforementioned, the second CMP process stops at the first hardmask 212 to expose the first hardmask 212. An etching process is applied for removing the first hardmask 212. Besides, an etching back process is applied to recess the isolation layer 160, wherein the top surface of the isolation layer 160 is below the top surface of the active fin structure 140. However, a top surface of the isolation layer 160 is above the top surface of the dummy fin structure 150, and thus the isolation layer 160 totally covers the dummy fin structure 150. In various embodiments, the first hardmask 212 is removed by a wet etching process using $H_3PO_4$ solution. In various embodiments, the isolation layer is recessed by a wet etching process using a solution of HF.

In FIG. 4K, the gate 170 is formed on the active fin structure 150 and overlapped with sidewalls of the active fin structure 150. The gate 170 is formed of polycrystalline-silicon (poly-Si), poly-crystalline silicon germanium (poly-SiGe), silicon nitride, or other suitable materials. The gate 170 is formed by a suitable procedure including deposition and patterning. The patterning process further includes lithography and etching. In various examples, the deposition includes CVD, PVD, ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). In various embodiments, the gate 170 is replaced later with a high-k dielectric layer (HK) and metal gate electrode (MG) after high thermal temperature processes, such as thermal annealing for S/D activation during the sources/drains formation.

As aforementioned, the selective ratio is controlled to regulate the height H1 of the dummy fin structure 150. On this base, the various embodiments provide a process of controlling the heights of the fin structures. As shown in FIG. 5A, a first fin structure 520 and a second fin structure 530 are formed from a substrate 510, and the first fin structure 520 and the second fin structure 530 both have a height H2 above the substrate 510. Portions of the substrate 510 are removed to form the first fin structure 520 and the second fin structure 530. Besides, a first hardmask 522 is disposed on the first fin structure 520, and a second hardmask 532 is disposed on the second fin structure 530, which the first hardmask 522 and the second hardmask 532 are formed from a hardmask layer. Also, an isolation layer 540 covers over the first fin structure 520 and the second fin structure 540, and a top surface of the isolation layer 540 is planarized. More specifically, the isolation layer 160 also covers over the first hardmask 522 and second hardmask 532.

In FIG. 5B, the portion of the isolation layer 540 above the first fin structures 520 is removed to expose the hardmask 522. Then, the first hardmask 522 is removed to form an opening 541 exposing the first fin structures 520. The isolation layer 540 is removed using a mask having the patterned layer, the middle layer and the bottom shown in FIG. 4D, and the details are not described herein. In various embodiments, the first hardmask 522 is removed by a wet etching process using $H_3PO_4$ solution. In various embodiments, the first hardmask 522 is removed by a dry etching process using plasma of $CH_3F$, $CH_2F_2$, $O_2$ or combination thereof.

Figure 5C:
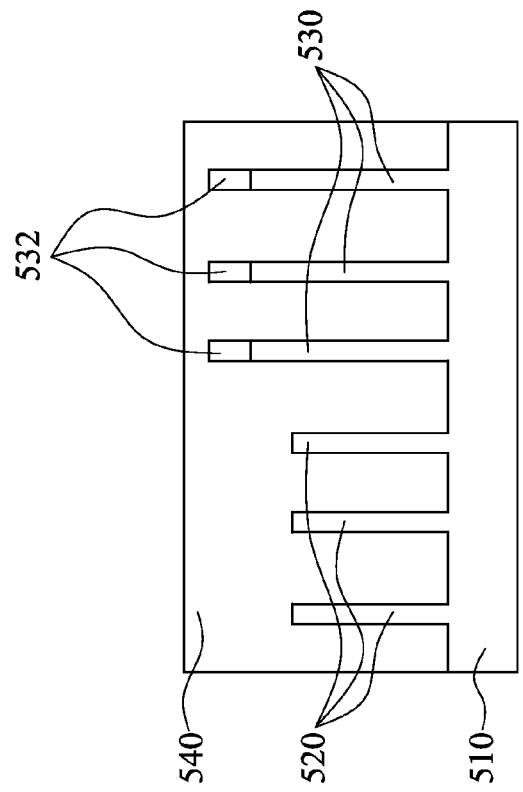

In FIG. 5C, the first fin structure 520 is selective etched, and an opening 542 is formed. The first fin structure 520 is selective etched through the opening 541 to reduce the height H2 of the first fin structure 520 to a height H3, and thus remains the opening 542. A first selective ratio of the first fin structure 520 to the isolation layer 540 is controlled to remain the height H3 above the substrate 510. In various embodiments, the first fin structure 520 is selective etched by a dry etching process using plasma of HBr, $Cl_2$, $O_2$, $N_2$ or combination thereof, but not limited thereto. In various embodiments, the first fin structure 520 is selective etched by a wet etching process using a solution of TMAH, $NH_3$ or combination thereof, but not limited thereto. In various embodiments, the first selective ratio is over 8 in order to control the profile and critical dimension of the opening 542 during selective etching the first fin structure 520. In some embodiments, the first selective ratio is in a range from about 8 to about 15. In some embodiments, the first selective ratio is in a range from about 10 to about 13.

Figure 5D:
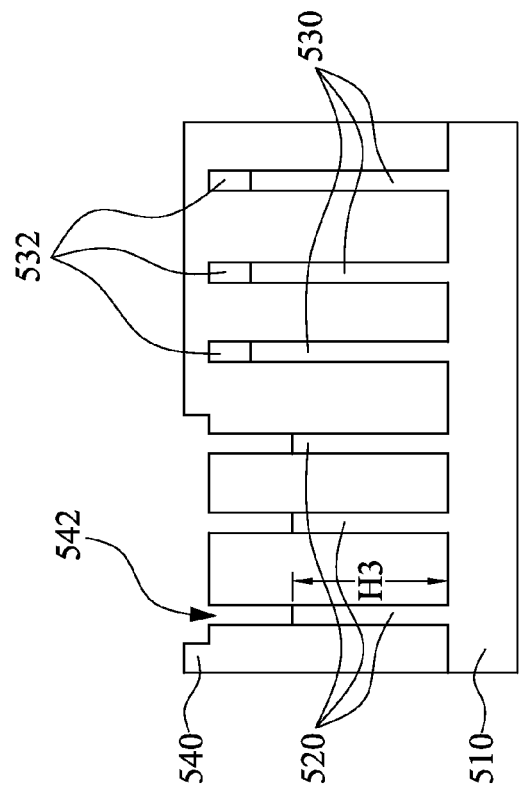

Referring to FIG. 5D, material same as the isolation layer 540 is refilled in the opening 542, and a CMP process is performed to planarize the top surface of the isolation layer 540.

Figure 5F:
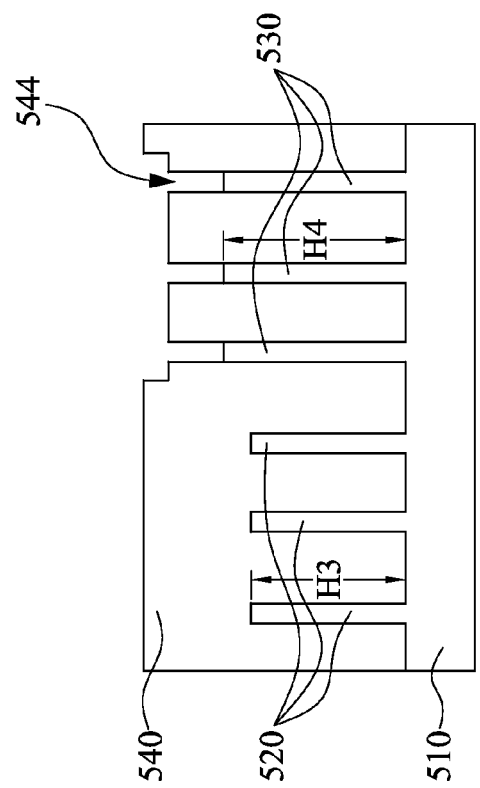
Figure 5E:
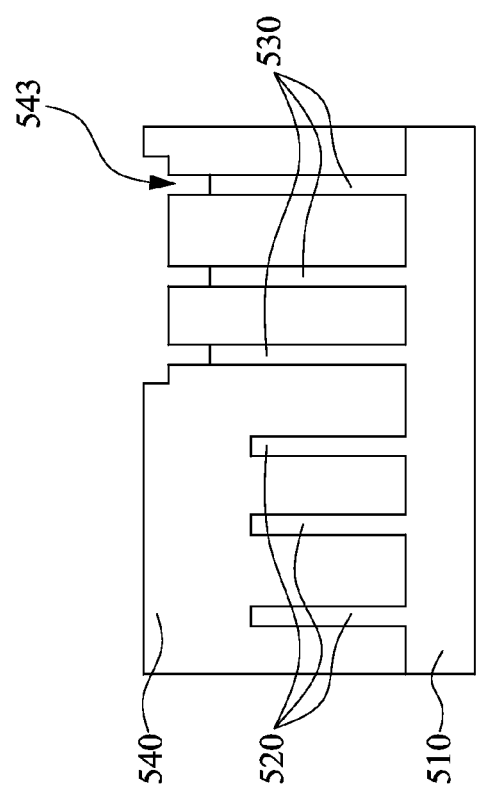

In FIG. 5E, the portion of the isolation layer 540 above the second fin structures 530 is removed to expose the hardmask 532. Then, the second hardmask 532 is removed to form an opening 543 exposing the second fin structure 530. The isolation layer 540 is removed using a mask having the patterned layer, the middle layer and the bottom shown in FIG. 4D, and the details are not described herein. In various embodiments, the second hardmask 532 is removed by a wet etching process using $H_3PO_4$ solution. In various embodiments, the first hardmask 522 is removed by a dry etching process using plasma of $CH_3F$, $CH_2F_2$, $O_2$ or combination thereof.

Referring to FIG. 5F, the second fin structure 530 is selective etched, and an opening 544 is formed. The second fin structure 530 is selective etched through the opening 543 to reduce the height H2 of the second fin structure 530 to a height H4, and thus remains the opening 544. A second selective ratio of the second fin structure 530 to the isolation layer 540 is controlled in the selective etching process to remain the height H4 above the substrate 510. In various embodiments, the second fin structure 530 is selective etched by a dry etching process using plasma of HBr, $Cl_2$, $O_2$, $N_2$ or combination thereof, but not limited thereto. In various embodiments, the second fin structure 530 is selective etched by a wet etching process using a solution of TMAH, $NH_3$ or combination thereof, but not limited thereto. In various embodiments, the second selective ratio is over 8. In some embodiments, the second selective ratio is in a range from about 8 to about 15. In some embodiments, the second selective ratio is in a range from about 10 to about 13.

As shown in FIG. 5F, the height H3 of the first fin structure 520 is lower than the height H4 of the second fin structure 530, since a reduced height of the first fin structure 520 is higher than a reduced height of the second fin structure 530. The reduced height represents a height of the fin structure 520 or 530 reduced by the selective etching, which is an etching depth of the fin structure 520 or 530. Controlling different selective ratios of the fin structures 520 and 530 to the isolation layer 160, the fin structures with different heights could be fabricated in the Fin-FET device, and thus enlarges the range of application. In various embodiments, the height H3 of the first fin structure 520 is higher than the height H4 of the second fin structure 530, since the reduced height of the first fin structure 520 is lower than the reduced height of the second fin structure 530.

Figure 5H:
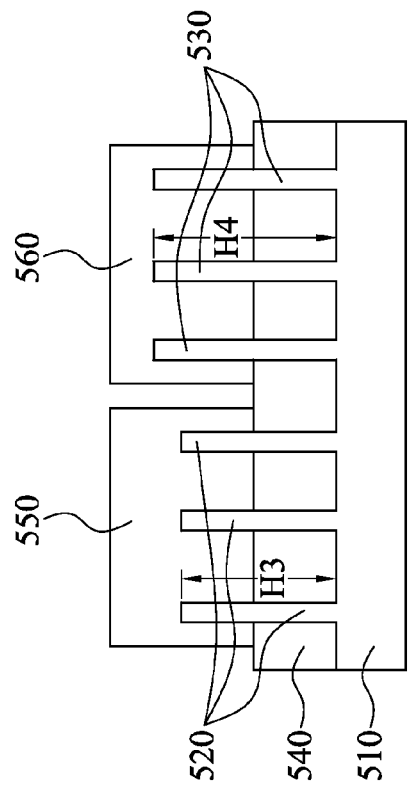
Figure 5G:
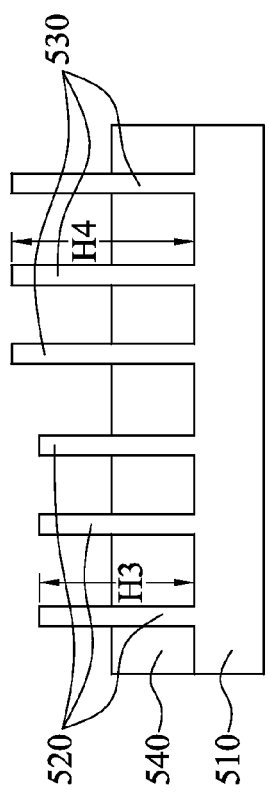

Referring to FIG. 5G, the isolation layer 540 is recessed corresponding to a top surface of the first fin structure 520 and the second fin structure 530. An etching back process is applied to recess the isolation layer 540, and the top surface of the isolation layer 540 is below the top surface of the first fin structure 520 and the second fin structure 530. More specifically, the thickness of the isolation layer 540 above the substrate 510 is smaller than the heights H3 and H4. In various embodiments, the isolation layer 540 is recessed by a wet etching process using a solution of HF.

Continuing in FIG. 5H, the first gate 550 is formed on the first fin structures 520 and overlapped with sidewalls of the first fin structure 520, and the second gate 560 is formed on the second fin structure 530 and overlapped with sidewalls of the second fin structure 530. The first gate 550 and the second gate 560 are formed of polycrystalline-silicon (poly-Si), poly-crystalline silicon germanium (poly-SiGe), silicon nitride, or other suitable materials. In various embodiments, the first gate 550 and second gate 560 are replaced later with a high-k dielectric layer (HK) and metal gate electrode (MG) after high thermal temperature processes, such as thermal annealing for S/D activation during the sources/drains formation.

The embodiments of the present disclosure discussed above have advantages over existing processes, and the advantages are summarized below. According to some embodiments, the isolation layer acts as a mask to protect the active fin structure during performing the fin-cut process. Because a CMP process is performed to assure the uniformity of the isolation layer, which is beneficial to act as the mask to avoid the damage risk on the active fin structure. Also, the selective ratio of the dummy fin structure to the isolation layer is controlled to be over 8 to assure that the fin-cut process will not affect the profile of the active fin structure. Besides, the selective ratio could be controlled to regulate the heights of the fin structures above the substrate, which enhances the efficiency of the process.

On the other hand, the top surface of the isolation layer is planarized before coating the mask layer so as to increase the uniformity of the mask layer, and thus also increases the exposure focus of the mask layer. Summarize above points, the method is provided to avoid damage and residue defect on the wanted fin structure, and the performance of the Fin-FET device becomes more stable In accordance with some embodiments, the present disclosure discloses a process of manufacturing a Fin-FET device, and the process includes following steps. An active fin structure and a dummy fin structure are formed from a substrate, and an isolation layer is covered over the active fin structure and the dummy fin structure. Then, the isolation layer above the dummy fin structure is removed, and the dummy fin structure is selectively etched, which a selective ratio of the dummy fin structure to the isolation layer is over 8.

In accordance with various embodiments, the present disclosure discloses a process of manufacturing a Fin-FET device, and the process includes following steps. A hardmask layer is formed on a substrate, and a plurality of fin spacers are formed on the hardmask layer. The hardmask layer and the substrate is removed through the fin spacers to form an active fin structure with a first hardmask thereon and a dummy fin structure with a second hardmask thereon, and an isolation layer is covered over the first hardmask and the second hardmask. The isolation layer on the second hardmask is removed, and the second hardmask is also removed. Then, the isolation layer and the dummy fin structure are removed, which a removing speed of the dummy fin structure is over 8 times higher than a removing speed of the isolation layer.

In accordance with various embodiments, the present disclosure discloses a process of controlling heights of fin structures, and the process includes following steps. A first fin structure and a second fin structure are formed from a substrate, and an isolation layer is covered over the first fin structure and the second fin structure. The isolation layer above the first fin structure is removed, and then controlling a first selective ratio of the first fin structure to the isolation layer to reduce a height of the first fin structure. The isolation layer is refilled, and the isolation layer above the second fin structure is removed. After that, a second selective ratio of the second fin structure to the isolation layer is controlled to reduce a height of the second fin structure, wherein the first fin structure and the second fin structure include different heights.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process of manufacturing a Fin-FET device, comprising:
    forming an active fin structure and a dummy fin structure from a substrate;
    disposing an isolation layer to cover the active fin structure and the dummy fin structure;
    selectively removing the isolation layer above the dummy fin structure to expose the dummy fin structure;
    selectively etching a first portions of the dummy fin structure to form recesses in the isolation layer, wherein a selective ratio of the dummy fin structure to the isolation layer is over 8;
    forming an isolation material in the recesses of the isolation layer; and
    recessing the isolation layer and the isolation material.

2. The process of claim 1, wherein forming the active fin structure and the dummy fin structure from the substrate comprises:
    forming a plurality of sidewall spacers on the substrate; and
    recessing a top surface of the substrate through the sidewall spacers.

3. The process of claim 1, further comprising planarizing the isolation layer.

4. The process of claim 1, wherein the dummy fin structure is selectively etched by a wet etching process using a solution of TMAH, $NH_3$ or combination thereof.

5. The process of claim 1, wherein the dummy fin structure is selectively etched by a dry etching process using plasma of HBr, $Cl_2$, $O_2$, $N_2$ or combination thereof.

6. The process of claim 1, wherein the selective ratio is in a range from about 8 to about 15.

7. The process of claim 6, wherein the selective ratio is in a range from about 10 to about 13.

8. A process of manufacturing a Fin-FET device, comprising:
    forming a hardmask layer on a substrate;
    forming a plurality of sidewall spacers on the hardmask layer;
    etching the hardmask layer and recessing the substrate through the sidewall spacers to form an active fin structure with a first hardmask thereon and a dummy fin structure corresponding to a second hardmask thereon;
    disposing an isolation layer to cover the first hardmask and the second hardmask;
    removing the isolation layer over the dummy fin structure;
    removing the second hardmask;
    selectively etching the isolation layer and a first portion of the dummy fin structure, wherein a removing speed of the dummy fin structure is over 8 times higher than a removing speed of the isolation layer;
    forming an isolation material on a second portion of the dummy fin structure and in contact with the isolation layer; and
    recessing the isolation layer and the isolation material.

9. The process of claim 8, wherein forming a plurality of sidewall spacers on the hardmask layer comprises:
    forming a first dummy pattern on the hardmask layer;
    covering a first spacer layer over a top surface and sidewalls of the first dummy pattern;
    removing the first spacer layer, wherein the first spacer layer on the sidewalls of the first dummy pattern is remained; and
    removing the first dummy pattern.

10. The process of claim 8, wherein forming a plurality of sidewall spacers on the hardmask layer comprises:
    forming a first dummy pattern on the hardmask layer;
    covering a first spacer layer over a top surface and sidewalls of the first dummy pattern;
    removing a first portion of the first spacer layer, wherein a second portion of the first spacer layer that is on the sidewalls of the first dummy pattern remains;
    removing the first dummy pattern to form a second dummy pattern;
    covering a second spacer layer over the second dummy pattern;
    removing a first portion of the second spacer layer, wherein a second portion of the second spacer layer that is on the sidewalls of the second dummy pattern remains; and
    removing the second dummy pattern.

11. The process of claim 8, further comprising planarizing a top surface of the isolation layer after covering the isolation layer over the first hardmask and the second hardmask.

12. The process of claim 9, further comprising forming a gate on the active fin structure and overlapped with sidewalls of the active fin structure.

13. The process of claim 8, wherein the second hardmask is removed by $H_3PO_4$.

14. The process of claim 8, wherein the isolation layer is recessed by HF.

15. A process of controlling heights of fin structures, the process comprising:
    forming a first fin structure that has a plurality of first fins and a second fin structure that has a plurality of second fins from a substrate;
    disposing an isolation layer to cover the first fin structure and the second fin structure;
    removing the isolation layer above the first fin structure to expose the first fins;
    controlling a first selective ratio of the first fin structure to the isolation layer to reduce a height of the first fin structure and form recesses in the isolation layer and respectively on the recessed first fins;
    refilling the recesses of the isolation layer with an isolation material;
    removing the isolation layer above the second fin structure to expose the second fins;
    controlling a second selective ratio of the second fin structure to the isolation layer to reduce a height of the second fin structure, wherein the first fin structure and the second fin structure include different heights; and
    recessing the isolation layer and the isolation material.

16. The process of claim 15, wherein the first selective ratio and the second selective ratio are over 8.

17. The process of claim 16, wherein the first selective ratio and the second selective ratio are in a range from about 8 to about 15.

18. The process of claim 15, wherein an amount of reduction of the height of the first fin structure is larger than an amount of reduction of the height of the second fin structure such that the height of the first fin structure is lower than the height of the second fin structure.

19. The process of claim 15, wherein an amount of reduction of the height of the first fin structure is smaller than an amount of reduction of the height of the second fin structure such that the height of the first fin structure is higher than the height of the second fin structure.

20. The process of claim 1, wherein the isolation material is made of silicon oxide, silicon nitride, silicon oxynitride, or combinations thereof.

* * * * *